PROCESS FOR ELECTRICALLY INTERCONNECTING ELEMENTS ON DIFFERENT LAYERS OF A MULTILAYER PRINTED CIRCUIT ASSEMBLY
Filed Dec. 23, 1963 2 Sheets-Sheet 1
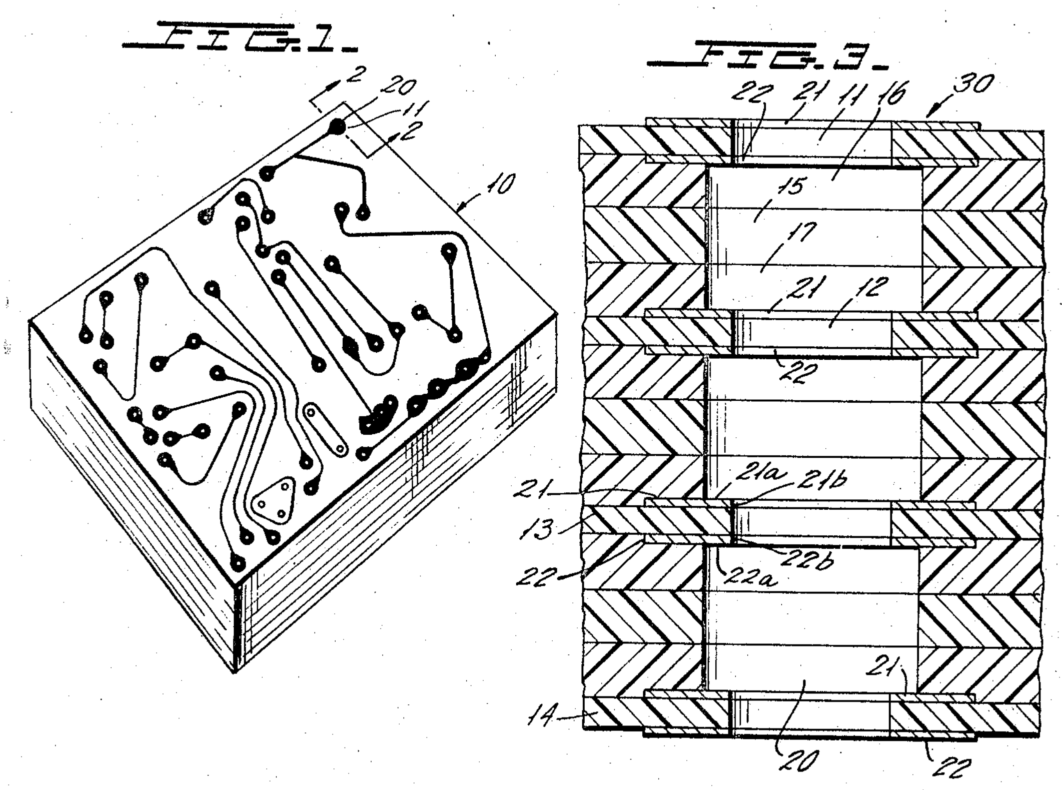
FIG. 1, FIG. 3
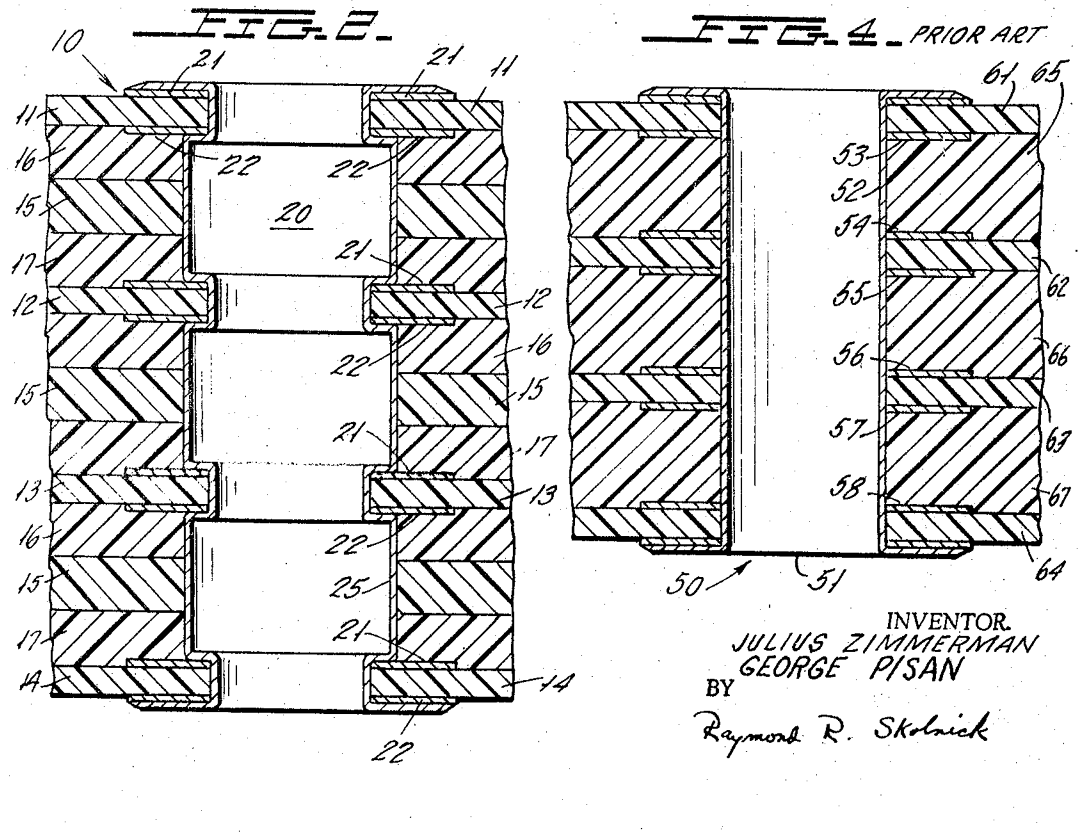
FIG. 2, FIG. 4 — PRIOR ART
INVENTOR.
JULIUS ZIMMERMAN
GEORGE PISAN
BY
Raymond R. Skolnick INVENTOR.
JULIUS ZIMMERMAN
GEORGE PISAN
BY
Raymond R. Skolnick 3,348,990

PROCESS FOR ELECTRICALLY INTERCONNECTING ELEMENTS ON DIFFERENT LAYERS OF A MULTILAYER PRINTED CIRCUIT ASSEMBLY

Julius Zimmerman, Brooklyn, and George Pisan, Hicksville, N.Y., assignors to Sperry Rand Corporation, Ford Instrument Company Division, Long Island City, N.Y., a corporation of Delaware Filed Dec. 23, 1963, Ser. No. 332,506
3 Claims. (Cl. 156—293)

The instant invention relates to printed circuitry in general and more particularly to novel processes for electrically interconnecting elements on different layers making a multilayer printed circuit card.

U.S. Patent Re. 24,165, originally issued February 26, 1952 to P. Eisler, describes methods of forming so-called printed circuit boards. In general, printed circuit boards are formed either by utilizing an etching process or an electrodeposition process. In each case the circuit conductors are formed in a layer a few thousandths of an inch thick with the conductors being formed directly on one or both surfaces of an insulating board.

For some purposes it is desirable to assemble a number of these boards in overlapping relationship and to electrically connect conductor elements on one board to selected conductors on one or more of the other boards. For the most part the prior art accomplished this interconnection by positioning the conductors on the various boards so that when the boards are assembled, areas on the elements to be interconnected are aligned one above the other. After the boards are bonded together to form a unitary structure, passages are drilled through the designated elements to be interconnected. Thereafter, the passages are plated with a metallic deposit which picks up and bonds itself to the various conducting elements thereby electrically interconnecting these elements.

Utilizing this process only the very thin edge portions of the conductive elements are contacted by the metallic deposit. Unless this prior art process is carried out with extreme care, high resistance joints are produced and these joints possess low mechanical strength. In order to overcome this difficulty of the prior art the instant invention provides a novel method for producing a multilayer printed circuit card of such construction that the metallic deposit picks up extensive surface portions of the conductive elements as well as the edge portions of the conductive elements.

Briefly, this is accomplished by predrilling and/or prepunching the insulating sheets between the printed circuit boards prior to assembly of the boards and sheets. Thereafter, holes are drilled through the assembly in alignment with the holes in the sheets. The holes in the conductors and boards are purposely made smaller than the holes in the insulating sheets so that surface portions of the conductive elements are exposed in the passage formed by each hole. Thus, when the passage is plated there is metallic deposit formed on the relatively extensive surface portions of the conductive elements exposed in the passage. This produces a low resistance joint of high mechanical strength.

In the typical prior art process for producing a multilayer printed circuit card the individual printed circuit boards are supported by a single layer of epoxy impregnated glass cloth with this layer typically being 0.003″ thick. The printed circuit boards with glass cloth sandwiched therebetween are pressed into a single laminated structure. In the instant invention the epoxy impregnated glass cloth layer is supplemented with adjacent layers of thermosetting adhesive films. This provides added bonding strength holding the layers of the card together and also provides a fuller resin body for more complete and uniform imbedding of the conductive elements without any tendency to form air gaps or pockets. Further, this technique results in a more reliable segregation of circuitry, especially in double-sided circuit boards and also makes possible the utilization of heavier thicknesses of copper for the conductive elements making for greater current carrying capacity.

In another embodiment of this invention the printed circuit boards and insulating sheets are joined to form a stack. Thereafter, holes are drilled or punched through the stack with these holes being tapped prior to plating. Since the thread surfaces are inclined with respect to the axis of the hole the portions of the conductors exposed for plating are more extensive than those portions exposed prior to tapping. Thus, more extensive areas, or lands, are exposed for plating.

Accordingly, a primary object of the instant invention is to provide a novel process for constructing a multilayer printed circuit card.

Still another object is to provide a process for producing a multilayer printed circuit card in which electrical interconnection between the conductive elements on different cards is achieved by a more reliable bonding structure.

Still another object is to provide a process of this type in which there is a better line-up of successive patterns and greater reliability in picking up and making contact with printed conductive elements by providing surface as well as edge exposure to the plating metal which joins the elements of the various layers.

A further object is to provide a process of this type in which holes punched through the conductors to be connected are tapped prior to plating.

A still further object is to provide a process of this type which results in the production of more circuitry per unit thickness with attendant increase in capacitance.

Another object is to provide a process of this type which results in a more reliable segregation of circuitry, especially in double-sided circuits and enables heavier thicknesses of copper to be utilized.

These as well as further objects of the instant invention shall become readily apparent after reading the following description of the accompanying drawings in which:

FIGURE 1 is a perspective of a multilayer printed circuit card constructed in accordance with the teachings of the instant invention.

FIGURE 2 is an enlarged cross section taken through line 2—2 of FIGURE 1 looking in the direction of arrows 2—2.

FIGURE 3 shows the elements of FIGURE 2 prior to electrically interconnecting the conductive elements of different layers.

FIGURE 4 is a view similar to FIGURE 2 showing a prior art construction in which elements of different layers are electrically connected.

In FIGURE 5 the stack is formed; in FIGURE 6 a hole is drilled and tapped in the stack; while in FIGURE 7 the hole is plated.

Figure 5:
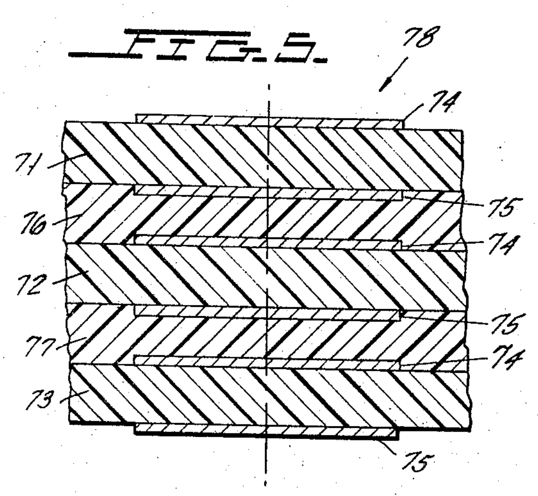
FIGURES 5 through 7 are enlarged fragmentary cross sections of a multilayer card during the stages of construction by another process according to the instant invention.

Now referring more particularly to FIGURES 1–4. Multilayer printed circuit card 10 includes four printed circuit boards 11–14 each constructed in a conventional manner and having conductive elements on both sides thereof. Sandwiched between boards 11 and 12 are insulating sheet 15 and adhesive films 16, 17 with film 16 being adjacent to board 11 and film 17 being adjacent to board 12. A similar combination of elements 15 through 17 separates boards 12 and 13 and still a similar combination of elements 15 and 17 separates boards 13 and 14.

Insulating sheet 15 is the typical epoxy impregnated glass cloth used by the prior art to insulate stacked printed circuit boards from one another. Each of the adhesive films 16 and 17 is constructed of a thermosetting material such as adhesive film #42 made by Minnesota Mining and Manufacturing Company.

The various layers 11–17 are formed with aligned apertures which combine to form passage 20 extending through card 10. Each of the printed circuit boards is provided with conductive elements 21, 22 on opposite surfaces thereof surrounding the aperture forming part of passage 20. Elements 21, 22 project into passage 20 and are bonded to electrically conductive coating 25 in passage 20. Thus, it is seen that coating 25 electrically interconnects the conductive elements 21, 22 of all four printed circuit boards 11–14.

Card 10 is formed by assembling printed circuit boards 11–14, insulating sheets 15 and adhesive films 16, 17 to form stack 30 (FIGURE 3) after the apertures forming passage 20 have been drilled in all of the various layers. In FIGURE 3 it is seen that the apertures through conductive elements 21, 22, respectively, are exposed in passage 20. Suitable amounts of pressure and heat are then applied to the stack 20 for the appropriate length of time so that layers 11–17 are bonded together, forming a cohesive structure. Thereafter, the surfaces defining passage 20 are plated through with a metallic deposit 25, which makes contact with conductors 21, 22 not only at edges **21*b*, 22*b*, but also at the extensive exposed surface portions 21*a*, 22*a***.

FIGURE 4 shows the typical prior art method for constructing a multilayer printed circuit card 50 in which double-sided printed circuit boards 61–64 are separated by and bonded to epoxy impregnated glass cloth layers 65–67. Through passage 51 is provided with plating 52 bonded solely to the edge portions of the internal conductors 52–57 of card 50. Since conductors 52–57 are very thin the edge portions do not provide sufficient surface areas for adequate bonding to coating 52.

In the alternative, card 10 is formed by assembling printed circuit boards 11–14, insulating sheets 15 and adhesive films 16, 17 in a suitable jig to form a stack which is subjected to pressure and heat, thereby forming a cohesive structure. Prior to assembly of the stack appropriately located apertures are drilled or punched through sheets 15 and films 16, 17. After the cohesive structure is formed, holes are drilled or punched in the stack with these holes being passed through appropriate conductors of boards 11–14. These holes are also in alignment with the apertures but are smaller in diameter. Thus, the structure of FIGURE 3 is formed.

Figure 6:
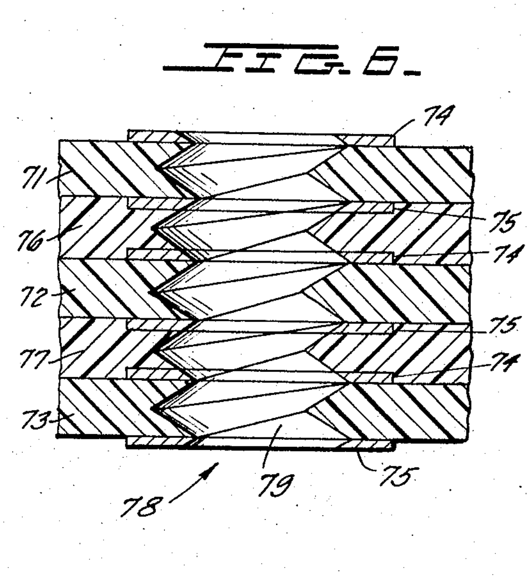
Figure 7:
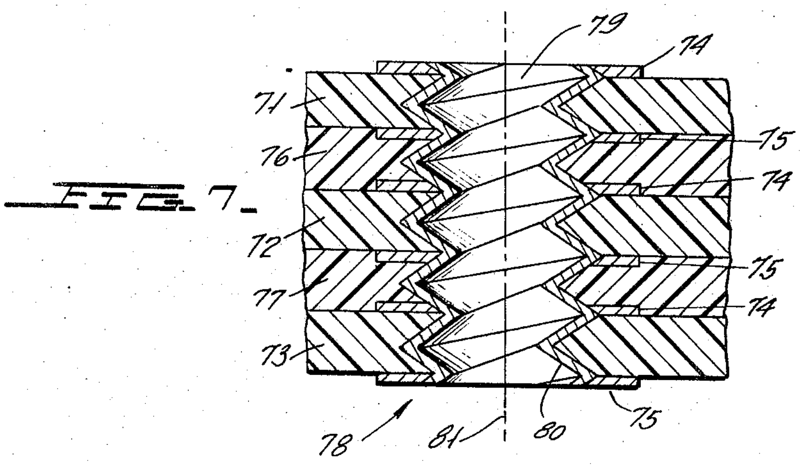

In the embodiment of this invention illustrated in FIGURES 5 through 7, printed circuit boards 71–73 each having conductors 74, 75 are separated by insulating sheets 76, 77 and boards 71–73 being bonded together to form stack 78 (FIGURE 5). Threaded aperture 79 is then formed in stack 78 (FIGURE 6) and the interior of aperture 79 is plated wtih metallic deposit 80 which is bonded to all six conductors 74, 75 (FIGURE 7). As clearly seen in FIGURE 6, the lands or portions of conductors 74, 75 exposed in passage 79 are inclined with respect to axis 81 of passage 79. These inclined lands provide much greater land areas than are provided by the prior art edge surfaces which extended parallel to the passage axis.

It should now be apparent to those skilled in the art that the principle of increasing the lands by tapping the plating passage may be extended by providing one or more grooves of any convenient configuration in the passage wall, even a series of grooves extending parallel to the passage axis.

Thus, it is seen that the instant invention provides a novel process for producing multilayer printed circuit cards in which extensive areas of the conductors are bonded to the conducting member which interconnects conductive elements of different layers. This is most conveniently accomplished by providing land areas having at least some portions formed transverse to the axis of the plating passage. The process is such that a fuller resin body is provided thereby resulting in a more complete and uniform imbedment of the circuit elements and also permits utilization of thicker conductive elements for greater current carrying capacity in double-sided circuits without the danger of short-circuiting.

Although there has been described a preferred embodiment of this novel invention, many variations and modifications will now be apparent to those skilled in the art. Threfore, this invention is to be limited, not by the specific disclosure herein, but only by the appending claims.

The embodiments of the invention in which an exclusive privilege or property is claimed are defined as follows:

1. A process for electrically interconnecting elements on different layers of a multilayer printed circuit assembly; said process comprising the steps of producing a stack having a plating passage; said stack including an insulating sheet between a first and a second printed circuit board each having a conductive element through which said passage extends; forming groove means in the wall of said passage to expose more extensive surface areas of said elements in said passage; and coating the surface of said passage with electrically conductive material bonded to surface portions of said elements exposed in said passage thereby conductively connecting said elements.

2. A process for electrically interconnecting elements on different layers of a multilayer printed circuit assembly; said process comprising the steps of reducing a stack having a plating passage; said stack including an insulating sheet between a first and a second printed circuit board each having a conductive element through which said passage extends; tapping said passage to form threads in the wall thereof to expose portions of said elements in said passage transverse to the axis of said passage; and coating the surface of said passage with electrically conductive material bonded to surface portions of said elements exposed in said passage thereby conductively connecting said elements.

3. A process for interconnecting elements on different layers of a multilayer printed circuit assembly; said process comprising the steps of producing a first and a second printed circuit board each having an aperture extending through the board and a conductive element formed thereon; providing an insulating sheet having a hole larger in size than said apertures; providing a first and a second adhesive film each having a hole larger in size than said apertures; arranging said films, said boards, and said sheet with said sheet between said films and said films interposed between said sheet and said boards to form an assembly in which said aperuures and said holes are aligned to constitute a passage with surface portions of said elements exposed in said passage; bonding the components of the assembly together; and coating the surface of said passage with a conducting material bonded to the surface portions of said elements exposed in said passage thereby conductively connecting said elements.

References Cited

UNITED STATES PATENTS

| | | | |
|---|---|---|---|
| Re. 24,165 | 6/1956 | Eisler | 156—3 |
| 2,502,291 | 3/1950 | Taylor | 174—68.5 |
| 2,771,663 | 11/1956 | Henry | 29—155.5 |
| 2,990,310 | 6/1961 | Chan | 174—68.5 |
| 3,077,511 | 2/1963 | Bohrer et al. | 29—155.5 X |
| 3,081,203 | 3/1963 | Beuscher | 134—28 |
| 3,201,851 | 8/1965 | Stearns | 174—68.5 X |
| 3,219,749 | 11/1965 | Schuster et al. | 174—68.5 |
| 3,234,060 | 2/1966 | Casement | 156—3 |

EARL M. EGBERT, *Primary Examiner.*

H. ANSHER, *Assistant Examiner.*